United States Patent
Liaw

(10) Patent No.: US 6,448,140 B1
(45) Date of Patent: *Sep. 10, 2002

(54) LATERALLY RECESSED TUNGSTEN SILICIDE GATE STRUCTURE USED WITH A SELF-ALIGNED CONTACT STRUCTURE INCLUDING A STRAIGHT WALLED SIDEWALL SPACER WHILE FILLING RECESS

(75) Inventor: Jhon-Jhy Liaw, Taipei (TW)

(73) Assignee: Taiwan Semiconductor Manufacturing Company, Hsin-Chu (TW)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 30 days.

(21) Appl. No.: 09/246,423

(22) Filed: Feb. 8, 1999

(51) Int. Cl.[7] .................. H01L 21/336; H01L 21/3205; H01L 21/4763
(52) U.S. Cl. ................ 438/279; 438/303; 438/592; 438/625; 438/630
(58) Field of Search ................ 438/279, 592, 438/701, 713, 625, 639, 303

(56) References Cited

U.S. PATENT DOCUMENTS

| | | | | |
|---|---|---|---|---|
| 4,285,761 A | * | 8/1981 | Fatula, Jr. et al. | |
| 4,927,777 A | * | 5/1990 | Hsu et al. | |
| 4,977,105 A | * | 12/1990 | Okamoto et al. | |
| 5,132,765 A | * | 7/1992 | Blouse et al. | |
| 5,139,968 A | | 8/1992 | Hagase et al. | 437/175 |
| 5,262,352 A | * | 11/1993 | Woo et al. | |
| 5,491,100 A | * | 2/1996 | Lee et al. | |
| 5,545,578 A | * | 8/1996 | Parks et al. | |
| 5,633,522 A | | 5/1997 | Dorleans et al. | 257/344 |
| 5,698,072 A | | 12/1997 | Fukuda | 156/653.1 |
| 5,792,684 A | | 8/1998 | Lee et al. | 438/238 |
| 5,994,192 A | * | 11/1999 | Chen | 438/303 |
| 6,001,719 A | * | 12/1999 | Cho et al. | 438/592 |
| 6,143,611 A | * | 11/2000 | Gilton et al. | 438/279 |

* cited by examiner

*Primary Examiner*—Richard Booth
*Assistant Examiner*—Ron Pompey
(74) *Attorney, Agent, or Firm*—George O. Saile; Stephen B. Ackerman

(57) ABSTRACT

A process for fabricating composite insulator spacers, comprised of an underlying silicon oxide sidewall layer, and an overlying silicon nitride layer, formed on the sides of a polycide gate structure, has been developed. The process features initially, laterally recessing the exposed sides of a tungsten silicide component, of the polycide gate structure, via use of a selective wet etch solution. A subsequent oxidation procedure, used to thermally grow the silicon oxide sidewall layer, results in a thick silicon oxide component, located on the recessed sides of the tungsten silicide layer, while a thinner silicon oxide component is formed on the sides of the polysilicon component, of the polycide gate structure. Deposition of a silicon nitride layer, followed by an anisotropic RIE procedure, are then used to form the composite insulator spacers, on the sides of the polycide gate structure.

19 Claims, 3 Drawing Sheets

LATERALLY RECESSED TUNGSTEN SILICIDE GATE STRUCTURE USED WITH A SELF-ALIGNED CONTACT STRUCTURE INCLUDING A STRAIGHT WALLED SIDEWALL SPACER WHILE FILLING RECESS

BACKGROUND OF THE INVENTION (1) Field of the Invention

The present invention relates to methods used to fabricate semiconductor devices, and more specifically to a method used to create a polycide, (metal silicide-polysilicon), gate structure, for a semiconductor device.

(2) Description of the Prior Art

The use of self-aligned contact, (SAC), structures, have allowed smaller area, source/drain regions to be used for metal oxide semiconductor field effect, (MOSFET), devices. The SAC structures, formed in openings that were created, self-aligned to a silicon nitride encapsulated, gate structure, result in metal contact to a borderless, source/drain region, eliminating the need of opening a fully landed contact hole, in an insulator layer, to the source/drain region. The replacement of the area consuming, non-borderless, source/drain contact hole opening, with a SAC opening, has allowed a reduction of source/drain area to be realized, thus resulting in smaller, higher performing MOSFET devices, with decreased source/drain to substrate capacitance, to be obtained.

The use of polycide gate structures, comprised of an overlying metal silicide layer, such as tungsten silicide, on an underlying polysilicon layer, can however present difficulties during an oxidation procedure, used as to form the sidewall oxide component, of the composite insulator spacers, on the sides of the polycide gate structure. Prior to forming a silicon nitride spacer, needed for the subsequent, selective, SAC opening procedure, an oxidation procedure is used to create the sidewall oxide layer, on the sides of the polycide gate structure. The faster growth of an oxide layer, on the exposed sides of the tungsten silicide layer, compared to the slower growth of an oxide layer, on the exposed sides of the polysilicon layer, can result in a sidewall oxide profile, with the thicker oxide layer protruding from the sides of the tungsten silicon layer. This profile can present difficulties, or a failure mechanism, during the subsequent, selective SAC opening procedure. For example the thicker oxide layer, butting out from the sides of the tungsten silicide layer, transfers to a conformal butting out, of an overlying silicon nitride layer, also used as a component of the composite insulator spacer. The anisotropic reactive ion etching, (RIE), procedure, used to finalize the composite insulator spacers, can remove the regions of silicon nitride exposed in an area in which the overlying silicon nitride protruded from the underlying thicker oxide layer, even resulting in exposure of the underlying sidewall oxide layer, via complete removal of silicon nitride in this region. The subsequent SAC opening, performed to selectively remove silicon oxide regions, can then attack the exposed sidewall oxide layer, resulting in gate to source/drain shorts, when interfaced by the SAC contact structure.

This invention will describe a solution to the undesirable sidewall oxide profile, resulting from the oxidation of a tungsten silicide—polysilicon, polycide gate structure. A selective wet etch solution, is used to laterally recess the tungsten silicide layer, allowing the thicker sidewall oxide layer, to be contained in the recessed region of the tungsten silicide layer, resulting in a smooth, non-protruding composite insulator layer. After deposition of a silicon nitride layer, and anisotropic RIE sidewall procedures, a non-defective, composite insulator layer results, allowing a successful SAC opening to be performed. Prior art, such as Fakuda, in U.S. Pat. No. 5,698,072, describes a process in which a top portion of a metal silicide layer is isotopically recessed, via a dry etching procedure. However that invention does not offer the lateral recess, of the entire metal silicide layer, via a wet etch procedure, followed by the growth of a thick oxide layer, entirely contained in the lateral recess, and overlaid with a silicon nitride layer, resulting in a subsequent composite insulator spacers, on the sides of a polycide gate structure, comprised of an overlying silicon nitride layer, and an underlying oxide layer, featuring a portion of the oxide layer, located in the lateral recess in the tungsten silicide layer.

SUMMARY OF THE INVENTION

It is an object of this invention to form a straight walled, silicon nitride capped, polycide gate structure, comprised of tungsten silicide, on polysilicon, via an anisotropic RIE procedure, followed by a isotropic wet etch procedure, used to laterally recess the tungsten silicide layer, with the lateral recess located between an overlying capping, silicon nitride layer, and the underlying polysilicon layer.

It is another object of this invention to grow a silicon oxide, sidewall layer, on the exposed sides of the polycide gate structure, with a thicker silicon oxide layer forming on the sides of the laterally recessed tungsten silicide layer, and a thinner silicon oxide layer forming on the exposed sides of the polysilicon layer.

It is still another object of this invention to deposit a silicon nitride layer, and via anisotropic RIE procedures, create composite insulator spacers, comprised of silicon nitride, overlying the thick silicon oxide component, located on the sides of the laterally recessed tungsten silicide layer, and overlying the thin silicon oxide layer, located on the sides of the polysilicon layer.

In accordance with the present invention a method is described for fabricating a MOSFET device, with composite insulator spacers, on the sides of a polycide gate structure, with the composite insulator spacers comprised of a silicon nitride layer, on a thick silicon oxide component of a silicon oxide sidewall layer, located on the sides of a laterally recessed tungsten silicide layer, and on a thin silicon oxide component, located on the sides of a polysilicon layer. A silicon nitride capped, polycide gate structure, comprised of a silicon nitride capping layer, a tungsten silicide layer, and a polysilicon layer, is formed via an anisotropic RIE procedure, on an underlying gate insulator layer. After creation of lightly doped source/drain regions, in an area of the semiconductor substrate, not covered by the silicon nitride capped, polycide gate structure, an isotropic wet etch procedure, is performed to selectively, create a lateral recess in the tungsten silicide layer, with the lateral recess located between the overlying, capping silicon nitride layer, and the underlying polysilicon layer. An oxidation procedure is used to grow the silicon oxide sidewall oxide layer, of the composite insulator spacer, comprised of a thick silicon oxide component, located on the sides of the laterally recessed, tungsten silicide layer, filling the recess, and a thinner silicon oxide component, formed on the exposed sides of the polysilicon layer. A silicon nitride layer is next deposited, followed by an anisotropic RIE procedure, resulting in the composite insulator spacers, comprised of an overlying silicon nitride layer, overlying a silicon oxide sidewall layer, comprised of a thick silicon oxide component, on the sides of the laterally recessed, tungsten suicide layer, and a thinner silicon oxide component, on the sides of the polysilicon layer. After formation of heavily doped source/drain regions, an interlevel silicon oxide layer is deposited, followed by creation of a SAC opening, in the interlevel silicon oxide layer, exposing a heavily doped source/drain region. The SAC opening, allowing a subsequent fully landed SAC structure to be formed on the heavily doped source/drain region, was selectively formed in the interlevel silicon oxide layer, using the silicon nitride capping layer, and the silicon nitride component of the composite insulator spacers, as etch stops.

BRIEF DESCRIPTION OF THE DRAWINGS

The object and other advantages of this invention are best described in the preferred embodiment with reference to the attached drawings which include.

DESCRIPTION OF THE PREFERRED EMBODIMENTS

The process of forming a MOSFET device, featuring composite insulator spacers, on the sides of a silicon nitride capped, polycide gate structure, and using a lateral recess, formed in the tungsten silicide layer, of the polycide gate structure, to accommodate the thick component of a silicon oxide sidewall layer, will now be described in detail. This invention will be shown for an N type, or NFET MOSFET device, however this invention can be applied to P type, PFET MOSFET devices, or to complimentary, (CMOS), devices. In addition this invention is described in a process sequence that uses SAC openings, and SAC structures, however the use of the composite insulator spacers, on polycide gate structures, formed featuring a laterally recess in the metal silicide layer, of the polycide gate structure, can be applied to static random access memory, (SRAM), or dynamic random access memory, (DRAM), devices, fabricated without the SAC opening, and the SAC structure features.

Figure 1:
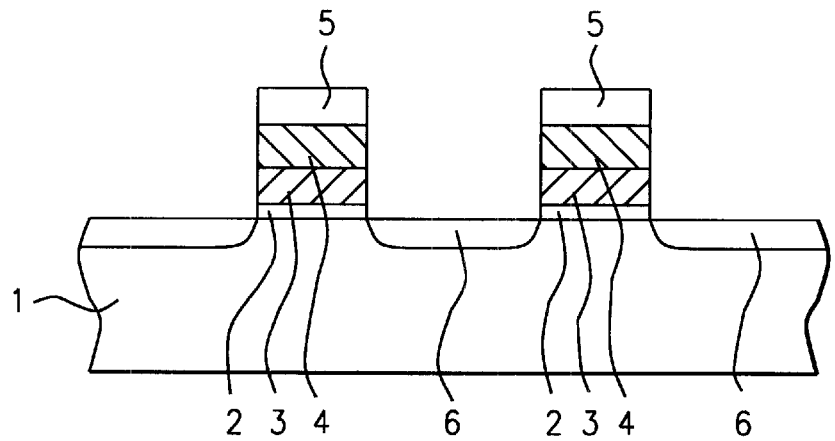
FIGS. 1–7, which schematically, in cross-sectional style, show the key stages of fabrication used to create composite insulator spacers, on a polycide gate structure, where the composite insulator spacers are comprised of a silicon nitride layer, on a silicon oxide sidewall layer, which in turn is comprised of a thick component of silicon oxide, located on the sides of a laterally recessed, tungsten silicide layer, and a thinner silicon oxide component, located on the sides of the polysilicon layer.

A P type, semiconductor substrate 1, comprised of single crystalline silicon, with a <100> crystallographic orientation is used, and shown schematically in FIG. 1. A silicon dioxide, gate insulator layer 2, is thermally grown in an oxygen—steam ambient, to a thickness between about 30 to 200 Angstroms. A polysilicon layer 3, is next obtained via low pressure chemical vapor deposition, (LPCVD), procedures, at a thickness between about 500 to 2500 Angstroms. Polysilicon layer 3, is doped in situ, during deposition, via the addition of arsine, or phosphine to a silane ambient. A tungsten silicide layer 4, is then deposited, again via LPCVD procedures, at a thickness between about 300 to 1500 Angstroms, using silane and tungsten hexafluoride as reactants. A hard mask, or capping layer of silicon nitride 5, is formed, via LPCVD or plasma enhanced chemical vapor deposition, (PECVD), at a thickness between about 1500 to 3000 Angstroms. An alternative to capping silicon nitride layer 5, is a composite capping, or hard mask layer, comprised of a thin silicon oxide layer, between about 100 to 1000 Angstroms, obtained via thermal oxidation, LPCVD, or PECVD procedures, and an overlying silicon nitride layer, obtained via LPCVD or PECVD procedures, at a thickness between about 1000 to 3000 Angstroms.

Conventional photolithographic, and anisotropic RIE procedures, using $CF_4$ as an etchant for capping silicon nitride layer 5, while using $Cl_2$ as an etchant for tungsten silicide layer 4, and for polysilicon layer 3, are used to form the silicon nitride capped, polycide gate structures, schematically shown in FIG. 1. Lightly doped source/drain region 6, also shown schematically in FIG. 1, is next formed via an ion implantation procedure, using arsenic, or phosphorous ions, at an energy between about 10 to 60 KeV, at a dose between about 1E13 to 3E14 atoms/cm$^2$. The photoresist shape, (not shown in the drawings), used as a mask for the definition of the silicon nitride capped, polycide gate structures, is removed via plasma oxygen ashing and careful wet cleans. The portion of gate insulator layer 2, not protected by the silicon nitride capped, polycide gate structures, is removed during this procedure, which include a post-oxygen plasma ashing, buffered hydrofluoric acid cycle.

Figure 2:
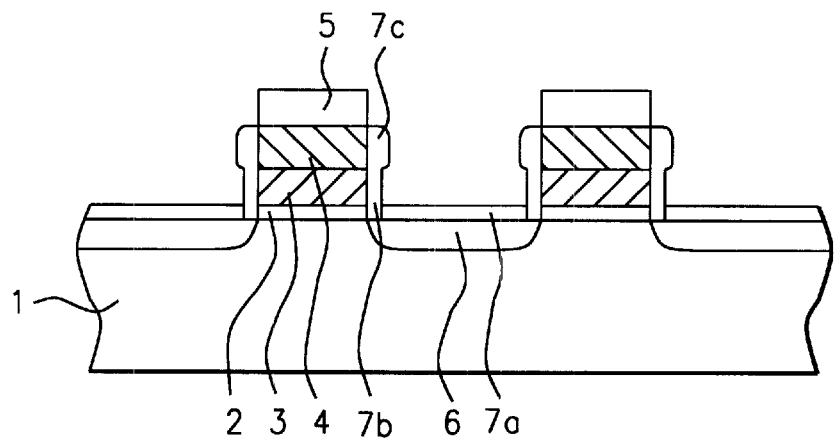
Figure 3:
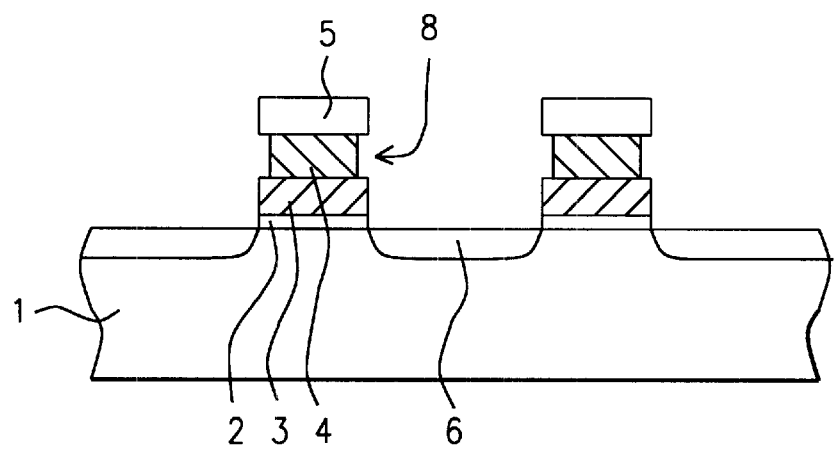

The composite insulator spacers, formed on the sides of the silicon capped, polycide gate structures, are to be comprised of an underlying silicon oxide layer, obtained via thermal oxidation procedures, and an overlying silicon nitride layer, obtained via chemical vapor deposition. However the use of thermal oxidation, to create the silicon oxide component of the composite insulator spacers, result in a silicon oxide growth, on the sides of the tungsten silicide layer, thicker than the silicon oxide layer formed on the sides of the polysilicon layer. FIG. 2, schematically shows the result of a thermal oxidation procedure, performed at a temperature between about 750 to 900° C., in an oxygen—steam ambient. The resulting silicon oxide sidewall layer, is comprised of thick silicon oxide component 7c, between about 100 to 400 Angstroms, on the sides of tungsten silicide layer 4, while a thinner silicon oxide component 7b, between about 50 to 200 Angstroms, forms on the sides of polysilicon layer 3. Silicon oxide layer 7a, at a thickness between about 35 to 100 Angstroms, is also formed on lightly doped source/drain region 6. Thick silicon oxide component 7c, will result in a protruding silicon nitride feature, when a subsequent, conformal layer of silicon nitride is deposited. An anisotropic RIE procedure, next used to create the composite insulator spacer, can result in unwanted attack of the protruding silicon nitride feature, possibly exposing a region of the silicon oxide sidewall layer. In addition, a subsequent SAC opening procedure, selectively etching a silicon oxide, interlevel dielectric layer, can also attack the exposed region of the silicon oxide sidewall layer, which can result in gate to substrate shorts, when the SAC opening is filled with the contact metal structure.

A process designed to accommodate the unequal growth of the silicon oxide sidewall layer, and thus avoid the consequences of the thick silicon oxide component, on the sides of the tungsten silicide layer, is now described, and shown schematically using FIGS. 3–7. A first critical procedure, the lateral recessing of tungsten silicide layer 4, is first addressed, and shown schematically in FIG. 3. After definition of the silicon nitride capped, polycide gate structures, lateral recess 8, is selectively created in tungsten silicide layer 4, via use a wet etch solution, comprised of $NH_4OH$—$H_2O_2$—$H_2O$. The wet etch procedure, performed at a temperature between about 25 to 80° C., results in lateral recess 8, extending inward between about 100 to 400

Angstroms. Silicon nitride capping layer 5, as well as polysilicon layer 4, are not attacked in the wet etching solution.

Figure 4:
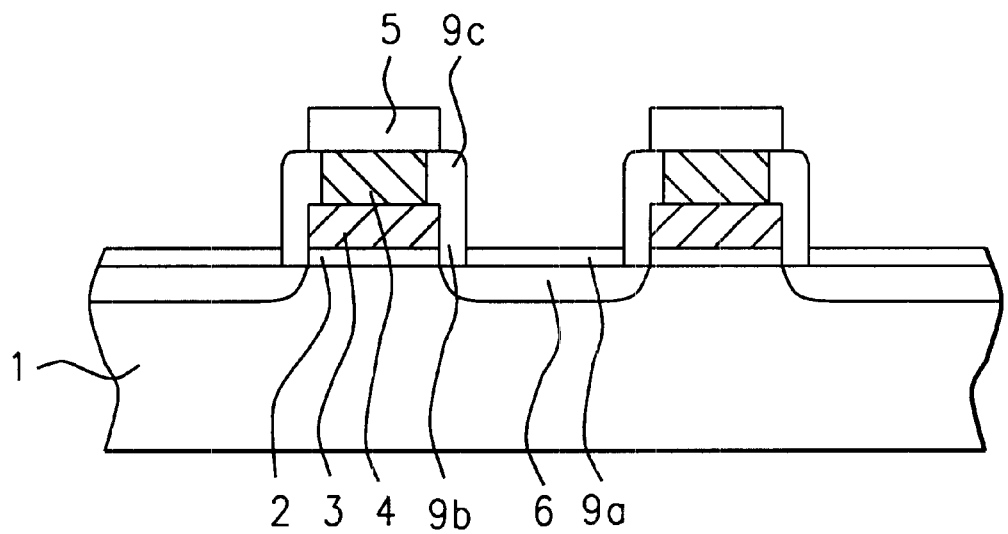

A second critical procedure, next addressed, and schematically shown in FIG. 4, is the growth of a silicon oxide sidewall layer, on the exposed sides of the silicon nitride capped, polycide gate structures. The silicon oxide sidewall layer is thermally grown, in an oxygen—steam ambient, at a temperature between about 750 to 900° C., resulting in thick silicon oxide component 9c, located on the sides of the laterally recessed, tungsten silicide layer 4, at a thickness between about 100 to 400 Angstroms. The same oxidation procedure results in the formation of thin silicon oxide component 9b, at a thickness between about 50 to 200 Angstroms, on the sides of polysilicon layer 3. Silicon oxide component 9a, at a thickness between about 35 to 100 Angstroms, is also formed on the surface of lightly doped source/drain region 6, during the thermal oxidation procedure. The resulting silicon oxide sidewall layer, comprised of thick silicon oxide component 9c, and thin silicon oxide component 9b, presents a straight walled profile, conducive to formation of a non-defective, composite insulator spacer, after deposition of a silicon nitride layer. A counterpart silicon oxide sidewall layer, previously shown in FIG. 2, did not allow the formation of a non-defective, composite insulator spacer to be realized, due to the thick silicon oxide component, residing on the non-recessed sides of the tungsten silicide layer.

Figure 5:
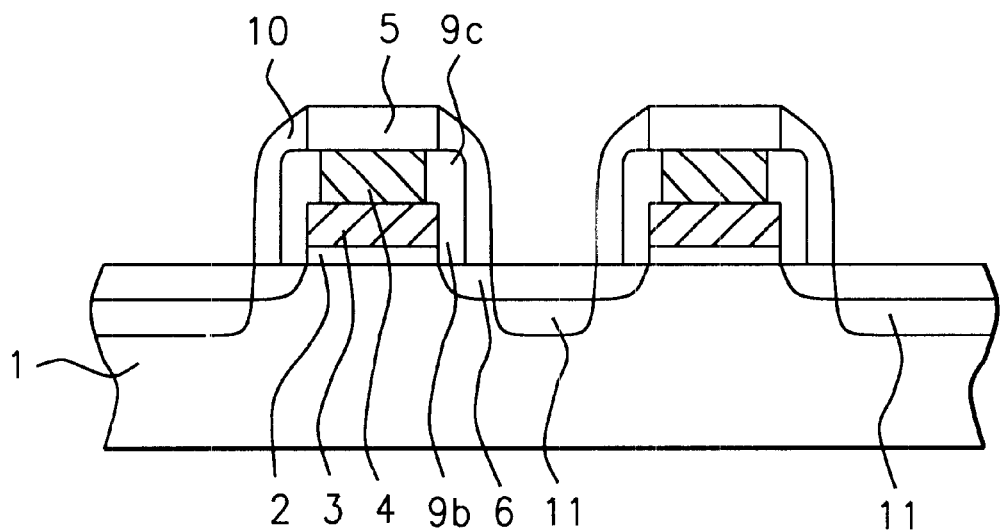
Figure 6:
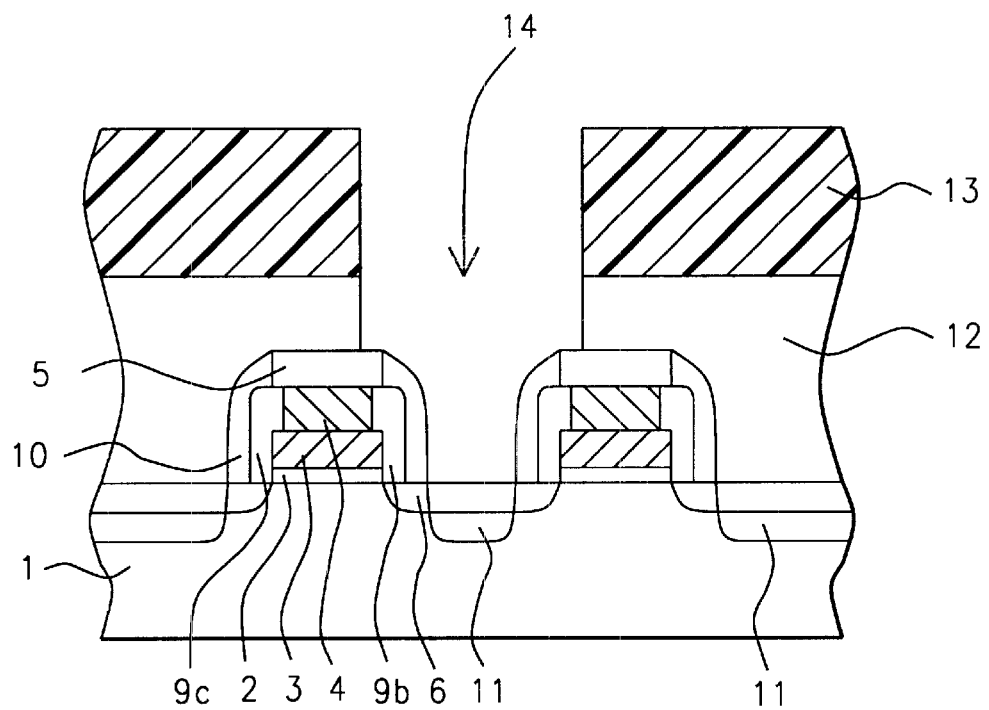

A conformal layer of silicon nitride is next deposited, via LPCVD or PECVD procedures, at a thickness between about 600 to 1500 Angstroms. The silicon nitride layer forms conformally on the underlying silicon oxide sidewall, comprised of thick silicon oxide component 9c, in lateral recess 8, on the sides of tungsten silicide layer 4, and comprised of thin silicon oxide component 9b, on the sides of polysilicon layer 3. An anisotropic RIE procedure, using $CF_4$ as an etchant, is employed to create silicon nitride spacers 10, shown schematically in FIG. 5, on the underlying silicon oxide sidewall. If lateral recess 8, was not previously formed in tungsten silicide layer 4, thick silicon oxide component 9b, would protrude, or extend out, from the sides of the polycide gate structure, resulting in a conformal silicon nitride layer, however with a region of the conformal silicon nitride layer, protruding or extending out, from the sides of the polycide gate structure, in the area where the silicon nitride layer overlaid thick silicon oxide component 9b. This would result in a composite insulator layer, of silicon nitride spacer 10, on the silicon oxide sidewall layer, however the protruding region of silicon nitride spacer 10, would have been exposed to the anisotropic RIE procedure, possibly resulting in exposure of the silicon oxide sidewall layer. Heavily doped source/drain regions 11, shown schematically in FIG. 5, are formed in regions of semiconductor substrate 1, not covered by silicon nitride capped, polycide gate structures, or by the composite insulator spacers, comprised of silicon nitride spacers 10, on the silicon oxide sidewall layer. Heavily doped source/drain regions 11, are formed via ion implantation of arsenic, or phosphorous ions, at an energy between about 15 to 80 KeV, at a dose between about 1E15 to 6E15 atoms/cm².

An interlevel dielectric, (ILD), layer 12, comprised of an undoped silicon oxide layer, and a boro-phosphosilicate layer, is deposited via LPCVD or PECVD procedures, at a thickness between about 6000 to 15000 Angstroms. Photoresist shape 13, is used as a mask to selectively define self-aligned contact, (SAC), opening 14, in ILD layer 12, schematically shown in FIG. 6. An anisotropic RIE procedure, using $CHF_3$ as an etchant, is used to selectively form SAC opening 14, in ILD layer 12. The selectivity, or high etch rate ratio, between ILD silicon oxide layer 12, and silicon nitride, (regarding capping silicon nitride layer, and silicon nitride spacers 10), in the $C_4F_8$ dry etchant, of about 15 to 1, allows the definition of a borderless, SAC opening 14, with a width larger than the space between silicon nitride capped, polycide gate structures, to be realized. This allows the entire active device region, located between silicon nitride capped, polycide gate structures, to be exposed. However if lateral recess 8, were not previously created, defective silicon nitride spacers 10, would have been present, allowing attack of the underlying silicon oxide sidewall layer to occur, during the selective RIE procedure, used for SAC opening 14.

Figure 7:
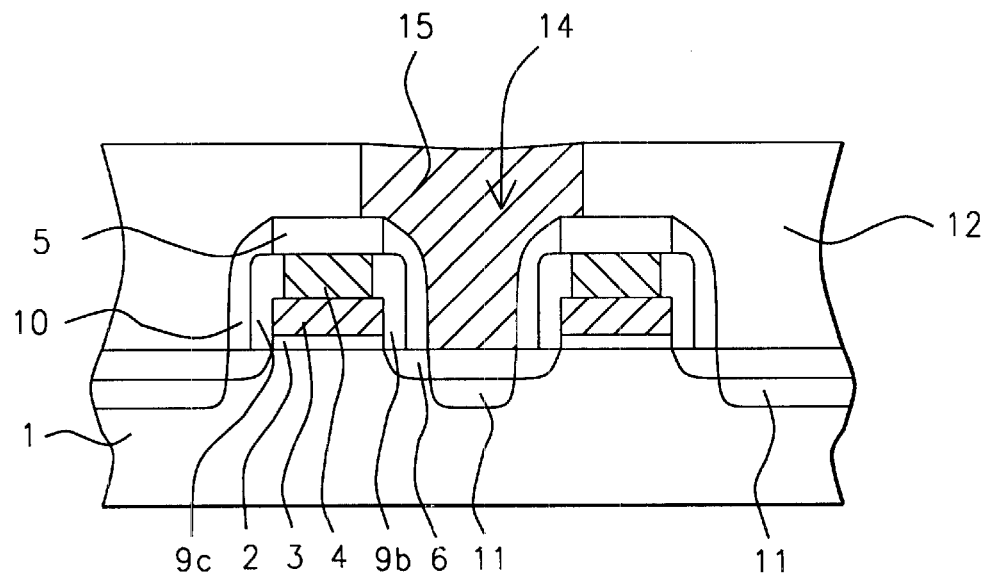

After removal of photoresist shape 13, via plasma oxygen ashing and careful wet cleans, SAC structure 15, shown schematically in FIG. 7, is formed in SAC opening 14. SAC structure 15, can be comprised of a refractory metal such as tungsten, or of an aluminum based layer. After metal deposition, LPCVD for tungsten, or R.F. sputtering for the aluminum based layer, at a thickness between about 2000 to 6000 Angstroms, completely filling SAC opening 14, a chemical mechanical polishing, (CMP), procedure, or a selective RIE procedure, using $Cl_2$ as an etchant, is used to remove unwanted regions of metal from the top surface of ILD layer 12, resulting in SAC structure 15. SAC structure 15, is isolated from silicon nitride capped, polycide gate structures, by the composite insulator spacer, with the integrity of the composite insulator spacer preserved by the creation of lateral recess 8, which in turn allowed the composite insulator spacer to survive the spacer RIE procedure.

While this invention has been particularly shown and described with reference to, the preferred embodiments thereof, it will be understood by those skilled in the art that various changes in form and details may be made without departing from the spirit and scope of this invention.

What is claimed is:

1. A method of forming a MOSFET device, on a semiconductor substrate, comprising sequential the steps of:

forming silicon nitride capped, polycide gate structures, on an underlying gate insulator layer, with a polycide layer, of said silicon nitride capped, polycide gate structures, comprised of a metal silicide layer, underlying a silicon nitride capping layer, and overlying a polysilicon layer;

ion implanting a first conductivity imparting dopant, into a region of said semiconductor substrate, not covered by said silicon nitride capped, polycide gate structures, to create a lightly doped source/drain region;

forming a lateral recess in the sides of said metal silicide layer;

performing a thermal oxidation procedure at a temperature between about 750 to 900° C. in an oxygen—steam ambient, to form a straight walled silicon oxide spacer, with a straight walled profile, on the sides of said silicon nitride capped, polycide gate structures, with said straight walled silicon oxide spacer comprised of a thick silicon oxide component, at a thickness between about 100 to 400 Angstroms, filling said lateral recess, in said metal silicide layer, and comprised of a thin silicon oxide component, at a thickness between about 50 to 200 Angstroms, located on the sides of said polysilicon layer, and with said thermal oxidation procedure forming a silicon oxide layer, at a thickness between about 35 to 100 Angstroms, on the surface of said lightly doped source/drain region;

depositing a silicon nitride layer on said straight walled silicon oxide spacer;

anisotropic etching of said silicon nitride layer to create composite insulator spacers on the sides of said silicon nitride capped, polycide gate structures, with said composite insulator spacers comprised of said silicon nitride layer, on said straight walled silicon oxide spacer;

ion implanting a second conductivity imparting dopant, into a region of said semiconductor substrate, not covered by said silicon nitride capped, polycide gate structures, or by said composite insulator spacers, to create a heavily doped source/drain region;

forming a self-aligned contact opening, in an interlevel dielectric layer, exposing a top portion of silicon nitride capped, polycide gate structures, and exposing said heavily doped source/drain region, located between said silicon nitride capped, polycide gate structures; and forming a self-aligned contact structure, in said self-aligned contact opening.

2. The method of claim 1, wherein said gate insulator layer is silicon oxide, thermally grown in an oxygen—steam ambient, to a thickness between about 30 to 200 Angstroms.

3. The method of claim 1, wherein said silicon nitride capping layer, is obtained via LPCVD or PECVD procedures, at a thickness between about 1500 to 3000 Angstroms.

4. The method of claim 1, wherein said metal silicide layer, of said silicon nitride capping, polycide gate structures, is a tungsten silicide layer, obtained via LPCVD procedures, at a thickness between about 300 to 1500 Angstroms, using silane and tungsten hexafluoride as reactants.

5. The method of claim 1, wherein said polysilicon layer, of said silicon nitride capped, polycide gate structures, is obtained via LPCVD procedures, at a thickness between about 500 to 2500 Angstroms, in situ doped, during deposition, via the addition of arsine, or phosphine, to a silane ambient.

6. The method of claim 1, wherein said silicon nitride capped, polycide gate structure, is formed via an anisotropic RIE procedure, using $CF_4$ as an etchant for said silicon nitride capping layer, and using $Cl_2$ as an etchant for said metal silicide layer, and for said polysilicon layer.

7. The method of claim 1, wherein said first conductivity imparting dopant, used to create said lightly doped source/drain region, is arsenic, or phosphorous ions, ion implanted at an energy between about 10 to 60 KeV, at a dose between about 1E13 to 3E14 atoms/cm$^2$.

8. The method of claim 1, wherein said lateral recess, in said metal silicide layer, between about 100 to 400 Angstroms, is created using a wet etch solution comprised of $NH_4OH$—$H_2O_2$—$H_2O$, at a temperature between about 25 to 80° C.

9. The method of claim 1, wherein said silicon nitride layer, of said composite insulator layer, is obtained via LPCVD or PECVD procedures, at a thickness between about 600 to 1500 Angstroms.

10. The method of claim 1, wherein said second conductivity imparting dopant, used to create said heavily doped source/drain region, is arsenic, or phosphorous ions, ion implanted at an energy between about 15 to 80 KeV, at a dose between about 1E15 to 6E15 atoms/cm$^2$.

11. The method of claim 1, wherein said self-aligned contact opening, is formed in said interlevel dielectric layer, via a selective, anisotropic RIE procedure, using $C_4F_8$ as an etchant, with the etch rate ratio of silicon oxide to silicon nitride, of about 15 to 1.

12. A method of forming composite insulator spacers on the sides of silicon nitride capped, polycide gate structures, on a semiconductor substrate, comprised of a silicon nitride layer, on a thermally grown, straight walled silicon oxide spacer, and with the straight walled silicon oxide spacer comprised of a thick silicon oxide component, located in a lateral recess in a tungsten silicide component of said silicon nitride capped, polycide gate structures, and comprised of a thin silicon oxide component, located on the sides of a polysilicon component of said silicon nitride capped, polycide gate structures, comprising sequential the steps of:

growing a silicon dioxide gate insulator layer;

depositing an in situ doped, polysilicon layer;

depositing a tungsten silicide layer;

depositing a silicon nitride capping layer;

performing an anisotropic RIE procedure, creating said silicon nitride capped, polycide gate structures, on underlying, said silicon dioxide gate insulator layer, with said silicon nitride capped, polycide gate structures comprised of said silicon nitride capping layer, of said tungsten silicide layer, and of said in situ doped polysilicon layer;

ion implanting a first conductivity imparting dopant, into a region of said semiconductor substrate not covered by said silicon nitride capped, polycide gate structures, to create a lightly doped source/drain region;

performing a wet etch procedure, to selectively create said lateral recess between about 100 to 400 Angstroms in the sides of said tungsten silicide layer;

performing a thermal oxidation procedure in an oxygen—steam ambient, at a temperature between about 750 to 900° C., to form said straight walled silicon oxide spacer with a straight walled profile, comprised of said thick silicon oxide component, between about 100 to 400 Angstroms in thickness, located on the sides of said tungsten silicide layer, in said lateral recess, and comprised of said thin silicon oxide component, between about 50 to 200 Angstroms in thickness, located on the sides of said polysilicon layer, while growing a silicon oxide layer between about 35 to 100 Angstroms, on the top surface of said lightly doped source/drain region;

depositing a silicon nitride layer;

anisotropic etching of said silicon nitride layer to create said composite insulator spacers, on the sides of said silicon nitride capped, polycide gate structures, with said composite insulator spacers comprised of said silicon nitride layer, and comprised of underlying, said straight walled silicon oxide spacer;

ion implanting a second conductivity imparting dopant, into a region of said semiconductor substrate, not covered by said silicon nitride capped, polycide gate structures, or by said composite insulator spacers, creating a heavily doped source/drain region;

depositing an interlevel dielectric layer;

performing an anisotropic reactive ion etching (RIE), procedure, using $C_4F_8$ as an etchant, to define a self-aligned contact hole in said interlevel dielectric layer, exposing a portion of the top surface of said silicon nitride capped, polycide gate structures, and exposing said heavily doped source/drain region, located between said silicon nitride capped, polycide gate structures, with an etch rate ratio of said interlevel dielectric layer to said silicon nitride layer of about 15 to 1, using said anisotropic RIE procedure; and forming a self-aligned, metal contact structure, in said self-aligned contact hole, contacting underlying, said heavily doped source/drain region.

13. The method of claim 11, wherein said silicon dioxide gate insulator layer is thermally grown in an oxygen—steam ambient, to a thickness between about 30 to 200 Angstroms.

14. The method of claim 12, wherein said in situ doped polysilicon layer is obtained via LPCVD procedures, at a thickness between about 500 to 2500 Angstroms, with the addition of arsine, or phosphorous, to a silane ambient.

15. The method of claim 12, wherein said tungsten silicide layer is obtained via LPCVD procedures, at a thickness between about 300 to 1500 Angstroms.

16. The method of claim 12, wherein said silicon nitride capping layer is obtained via LPCVD or PECVD procedures, at a thickness between about 1500 to 3000 Angstroms.

17. The method of claim 12, wherein said wet etch procedure, used to selectively create said lateral recess, in said tungsten silicide layer, is performed in a solution comprised of $NH_4OH$—$H_2O_2$—$H_2O$, at a temperature between about 25 to 80° C.

18. The method of claim 12, wherein said silicon nitride layer, used as a component of said composite insulator spacers, is obtained via LPCVD or PECVD procedures, at a thickness between about 600 to 1500 Angstroms.

19. The method of claim 12, wherein said composite insulator spacers, comprised of said silicon nitride layer, and underlying, said straight walled silicon oxide spacer, are formed via an anisotropic RIE procedure, applied to said silicon nitride layer, using $CF_4$ as an etchant.

* * * * *